United States Patent [19]

Curtis

[11] Patent Number: 4,890,071
[45] Date of Patent: Dec. 26, 1989

[54] SIGNAL GENERATOR UTILIZING A COMBINED PHASE LOCKED AND FREQUENCY LOCKED LOOP

[75] Inventor: George S. Curtis, Spokane, Wash.
[73] Assignee: Hewlett-Packard Company, Palo Alto, Calif.
[21] Appl. No.: 262,767
[22] Filed: Oct. 26, 1988
[51] Int. Cl.⁴ .......................... H03L 7/18; H03L 1/02
[52] U.S. Cl. ........................................ 331/11; 331/16; 331/18; 331/25; 331/176
[58] Field of Search .................. 331/10, 11, 12, 16, 331/17, 18, 23, 25, 176

[56] References Cited

U.S. PATENT DOCUMENTS

| | | | |
|---|---|---|---|
| 3,882,413 | 5/1975 | Healey, III | 331/12 X |
| 3,928,813 | 12/1975 | Kingsford-Smith | 331/1 A |
| 4,321,706 | 3/1982 | Craft | 375/59 |
| 4,336,505 | 6/1982 | Meyer | 331/12 X |

Primary Examiner—David Mis

[57] ABSTRACT

A programmable low noise frequency modulated signal source including a voltage controlled oscillator (VCO) having a frequency locked loop (FLL) constituting a first feedback path and a phase lock loop (PLL) constituting a second feedback path is provided. The PLL includes a VCO, a programmable fractional-N frequency division network and a phase detector for comparing the phase of the VCO output signal with the phase of a reference signal and for producing an error signal to controllably adjust the output frequency of the VCO. The FLL includes a delay line frequency discriminator, a loop amplifier and filter to provide a feedback signal to a frequency control terminal of the VCO. The frequency discriminator includes a first signal path having a frequency sensitive time delay network to provide a phase shift as a function of the VCO output signal frequency and a second signal path which includes a voltage controlled phase shifting network. The error signal derived from the PLL phase detector is coupled to an input terminal at the voltage controlled phase shifting network. The PLL error signal in combination with a bias signal adjusts the phase difference between the two frequency discriminator signal paths to set the operating point of the FLL phase detector such that the VCO output signal will have a desired frequency and minimum phase noise.

5 Claims, 5 Drawing Sheets

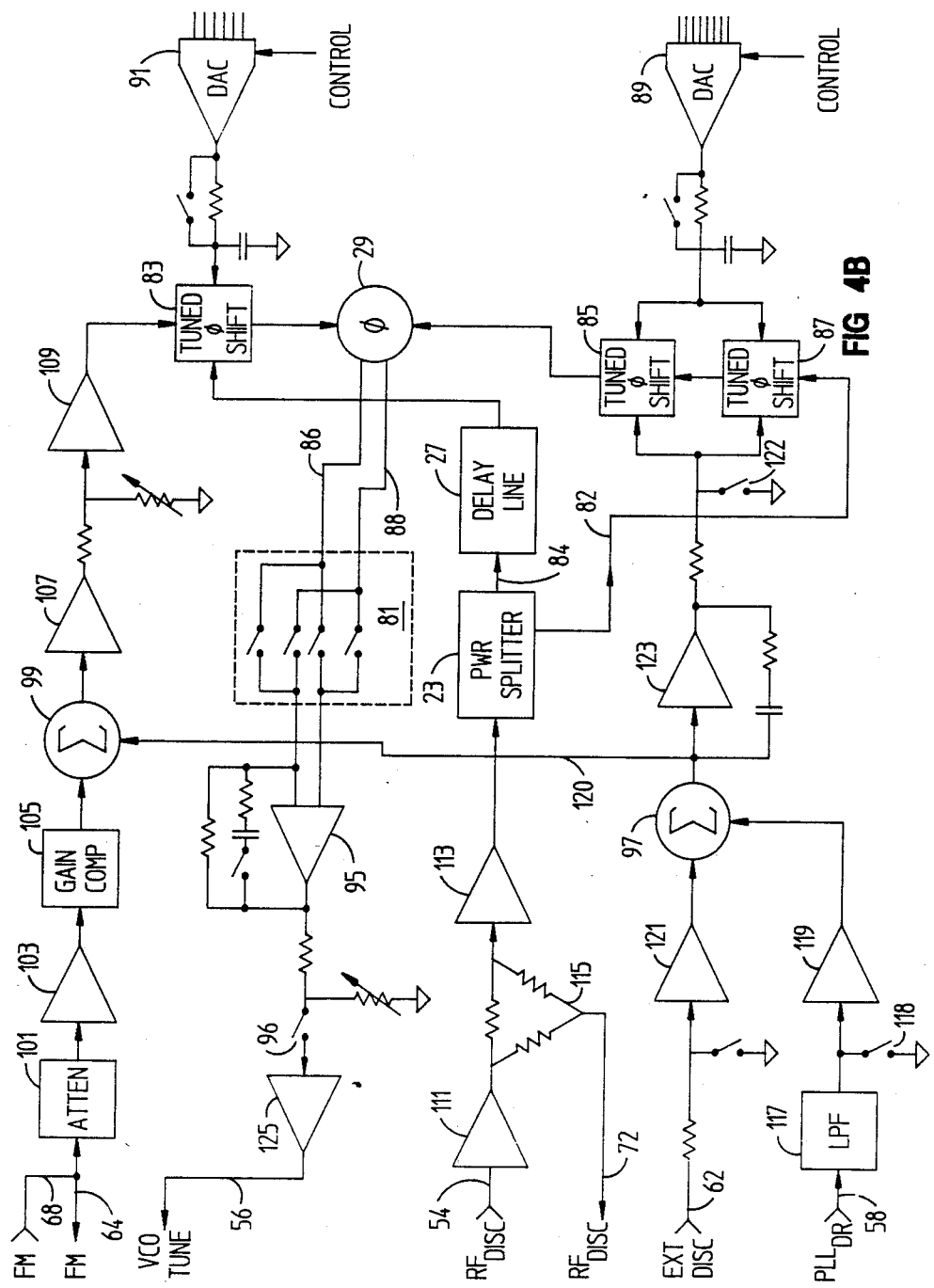

SIGNAL GENERATOR UTILIZING A COMBINED PHASE LOCKED AND FREQUENCY LOCKED LOOP

BACKGROUND OF THE INVENTION

The present invention relates generally to signal generators and more particularly, to a signal generator utilizing a combination phased locked loop and frequency locked loop and having a frequency discriminator including a voltage tuned phase shifter wherein the frequency of the loop signal source is controlled by applying a tune voltage from the phase locked loop to the voltage controlled phase shifter.

Signal generators or frequency synthesizers utilizing a phase locked loop (PLL) to provide an output signal having a selectable, precise and stable frequency are well known in the art. Such a PLL includes a tunable oscillator, typically a voltage controlled oscillator (VCO) the output of which is locked to a known reference signal by means of a phase comparator. The phase comparator generates an output voltage or current that is proportional to the phase difference between the known reference signal and the VCO output signal. The output of the phase comparator is coupled back to the input of the VCO to tune the VCO to a desired frequency. This forces the VCO output signal to have the same frequency as the reference signal. By interposing a divide-by-N block between the output of the VCO and the phase comparator, the reference frequency may instead be compared with the VCO output frequency divided by N. The VCO output frequency will then be N times the reference signal frequency where N is an integer. Another technique known as fractional-N is utilized to generate signals having a frequency that is any rational multiple of the reference signal frequency. Such a technique is disclosed U.S. Pat. No. 3,928,813 issued to Charles A. Kingsford Smith on Dec. 23, 1975, entitled "Device For Synthesizing Frequencies Which Are Rational Multiples Of A Fundamental Frequency".

Typically most phased locked loop circuits are designed to exhibit a relatively wide bandwidth and will operate to minimize phase and frequency perturbations occurring at rates within the phase locked loop bandwidth. In applications requiring a frequency or phase modulated signal the phase locked loop will operate to eliminate any variations in the signal frequency caused by a modulation signal. Thus, it has become necessary to develop various circuit arrangements for satisfactorily phase or frequency modulating such phase locked systems. A typical approach to frequency modulating a phase locked loop system in effect combines two modulation paths, the first of which accommodates FM rates within the bandwidth of the phase locked loop and the second of which accommodates FM rates greater than the phased locked loop bandwidth. This approach may require that compensating circuitry be included to equalize the signal delay in the two modulation paths to provide satisfactory circuit operation and obtain linear, frequency modulation over a desired range of carrier frequencies.

Further, because of the phase noise generated by voltage controlled oscillators is typically substantially higher than that of frequency modulated oscillators employing high Q resonant networks (e.g., a resonant cavity) prior art frequency modulated PLLs do not satisfy the extremely low noise characteristics required by today's applications.

One approach to providing a low noise, frequency modulated signal source comprises a voltage controlled oscillator (VCO) having a first feedback path for establishing and maintaining phase lock of the VCO at the desired signal frequency and includes a second feedback path that reduces VCO phase noise by supplying negative feedback that is proportional to the VCO phase noise to the VCO frequency control terminal. This circuit arrangement is, in effect, a combined phase locked loop and frequency locked loop (FLL). Both types of feedback loops have been used to stabilize and reduce the phase noise produced by VCOs. The combination of the two loops provide lower noise and better frequency stability than could be had by using one or the other of the two loops alone. However, the frequency modulation problems associated with typical prior art phase locked loop frequency synthesizers are not overcome or alleviated by the combined PLL and FLL. Typically an FLL comprises a frequency discriminator, a loop amplifier filter and a VCO. The frequency discriminator comprises a power or signal splitter, a time delay network (e.g., a surface acoustical wave delay device, a resonant circuit or a coaxial cable), a phase shifting apparatus and a phase detector. Typically an RF power amplifier is included to provide adequate signal levels at the phase detector and to compensate for losses of the passive components. The power splitter provides two signal paths which are coupled to the inputs of the phase detector. Including the time delay network in one signal path and not the other provides a phase shift of the signal proportional to input frequency which is detected by comparing the signals on the two paths at the phase detector. Typically, an RF phase detector utilized in a frequency discriminator comprises a balanced mixer having an output voltage proportional to the cosine of the detected phase difference. Variable phase shifting apparatus included in one or both of the phase detector signal paths provides a phase offset such that the cosine of the phase difference at the phase detector output is near zero over the frequency range of interest. The output of the phase detector is coupled back to the frequency control terminal of the VCO with the proper polarity to reduce VCO frequency fluxuations to the point where the VCO is as stable as the frequency discriminator itself, within the FLL bandwidth. Thus, the frequency discriminator effectively tracks a phase locked loop frequency and, by properly configuring the network, a VCO output signal having low phase noise is attained without significantly altering the frequency selection characteristics. U.S. Pat. No. 4,336,505 entitled "Controlled Frequency Source Apparatus Including A Feedback Path For The Reduction of Phase Noise" issued to Donald G. Meyer on June 22, 1982, discloses a phase locked loop apparatus including a frequency locked loop to provide a low noise signal source having remote signal selection capabilities, a frequency range of one octave or more and less phase noise than prior art phase locked loop systems. Meyer describes a FLL of the type described hereinabove including a frequency discriminator having a feedback path from the phase detector to the variable phase shifting apparatus to maintain a phase detector output at zero volts, the optimum operating point. U.S. Pat. No. 4,321,706 entitled "Frequency Modulated Phase Locked Loop Signal Source" issued to Kingsley W. Craft on Mar. 23, 1982 discloses a low noise frequency modulated signal source of the general type disclosed by Meyer including circuitry that automatically adjusts the level of an applied modulation signal so that a given modulation signal provides a predetermined frequency deviation at the center frequency of each frequency subband over the desired frequency range. Frequency modulation (FM) is achieved by coupling a first modulation signal into the frequency discriminator phase detector output to be summed with the frequency locked loop feedback and is primarily effective at frequencies outside the effective phase locked loop bandwidth. A second modulation signal is coupled to a VCO which provides the phase locked loop reference signal to provide FM within the phase locked loop bandwidth. Circuitry is also included to prevent the FM signal from reaching portions of the phase noise reducing circuitry that maintains the average value of the frequency discriminator phase detector output signal substantially equal to zero at the desired carrier frequency.

Delay line discriminators having low noise, high sensitivity and wide bandwidth characteristics when used in a frequency locked loop will provide a VCO output signal having minimum phase noise. The delay line discriminator effectively demodulates the VCO output signal and supplies negative feedback which is proportional to the VCO phase noise. Since any FM on the VCO output signal will be seen as a noise signal by the delay line discriminator, FM will also be eliminated by the frequency locked loop. The amount of cancellation of the FM is dependent on the gain of the FLL and is limited by the FM noise floor of the frequency discriminator. A first order FLL includes an integration amplifier between the phase detector output and the VCO frequency control input. To prevent attenuation of the FM, the modulation signal must be applied prior to this integration amplifier in the FLL. When using a balanced mixer as a phase detector for the frequency discriminator, the optimum operating point of the phase detector is with the output voltage at approximately zero volts. At this point, the sensitivity to phase changes is the highest and rejection of amplitude modulation on the RF carrier is the greatest. This is also the most linear operating point for the phase detector which is important for low distortion FM of the VCO output signal. FM of the VCO output signal achieved by the summation of the FM signal at the discriminator phase detector output forces the phase detector operating voltage away from zero, thus reducing the sensitivity and the linearity of the phase detector.

SUMMARY OF THE INVENTION

In accordance with the principles of the present invention, a programmable low noise frequency modulated signal source including a voltage controlled oscillator (VCO) having a first feedback loop comprising a frequency locked loop (FLL) and a second feedback loop comprising a phase locked loop (PLL) is provided. A fractional-N PLL includes the VCO, programmable fractional-N means for changing the rational number by which the VCO output signal is frequency divided, a phase detector for comparing the phase of the frequency divided output signal with the phase of a predetermined reference signal and for producing an error signal representing the detected phase difference and a loop filter for suitably processing the phase detector error signal to produce a tune signal for controllably adjusting the frequency of the VCO output signal. The FLL comprises a delay line frequency discriminator, a loop amplifier and filter and the VCO. The delay line discriminator includes a power or signal splitter to provide two signal paths each coupled to an input of a balance mixer phase detector. A time delay network having a time delay Tau provides a phase shift through one signal path which is proportional to frequency and a voltage controlled variable phase shifting network introduces a variable phase shift in the other signal path that is substantially constant over the frequency range centered about the desired VCO frequency. The result is the difference in phase between the signals at the phase detector inputs is a function of VCO frequency with an adjustable offset. The VCO tune voltage derived from the PLL phase detector error signal is coupled from the PLL amplifier to the voltage controlled phase shifting network. This tune voltage adjusts the phase difference between the inputs to the FLL phase detector changing the operating point of the FLL (i.e., the frequency at which the output of the FLL phase detector will be zero volts) and consequently changes the output frequency of the VCO. By measuring the frequency deviations of the VCO output signal utilizing the frequency discriminator and coupling the discriminator output to the VCO frequency control terminal with the proper polarity (i.e. negative feedback) the VCO frequency fluxuations can be reduced to the point where the VCO is as stable as the frequency discriminator itself within the FLL bandwidth.

In a FLL having sufficient loop gain, the FLL will tune the VCO frequency such that it forces the error voltage at the output of the phase detector ($V_d$) near zero volts and the VCO frequency to settle at a zero point that allows for stable operation of the FLL. Adjusting the variable phase shift network will cause the FLL to shift the VCO frequency to a new zero point for stable operation. The FLL, when tuned in this manner, may be modeled as a VCO having a low pass filter on its input to account for the FLL's inability to follow modulation higher in frequency than the FLL bandwidth. Many applications require better performance than an FLL alone can provide. In applications where phase coherency to a reference frequency or very low phase noise at small offset frequencies from the carrier frequency is required a narrow bandwidth PLL may be used. In contrast, the FLL is typically most successful at reducing phase noise at intermediate to large offsets from the carrier frequency. By coupling both a PLL and a FLL together, the advantages of both are gained. By coupling the tune signal derived from the PLL to the variable phase shift network, the effectiveness of the PLL VCO tune signal is not reduced by the FLL loop gain. Further, because the FLL phase detector is not forced to operate with an offset voltage at its output, the phase detector operates at maximum sensitivity and linearity. Combining the PLL and FLL networks in this manner allows for optimum operation of both loops.

To achieve low distortion FM over the frequency range of the VCO, the FM signal is also coupled to the voltage controlled variable phase shift network. For the reasons discussed hereinabove, applying the FM signal at the variable phase shifter provides many advantages. In the prior art, FM of a delay line discriminated VCO has been accomplished by summing the FM signal with the FLL phase detector output at the input to the FLL integration amplifier thus applying an offset voltage at the output of the phase detector. This moves the FLL phase detector away from its optimum operating point and reduces its sensitivity and linearity. The FM sensitivity of this method is given by $K_v=1/(2 \pi \text{Tau } K_0)$ where $K_0$ is the phase detector gain in volts per radian. For a balanced mixer phase detector, for example, $K_0$ is determined by the RF power at both input ports of the phase detector and the conversion loss of the phase detector. Since delay line losses, RF power from the power amplifiers and conversion loss of the phase detector are temperature sensitive, the FM sensitivity will be temperature sensitive. When the FM signal is applied to the variable phase shifting network, the FM sensitivity is not a function of phase detector gain, $K_0$, but is a function of the gain of the variable phase shifter ($K_p$). The gain of a voltage tunable phase shifting network is typically very insensitive to RF power level and temperature change. Therefore, the FM sensitivity versus temperature is greatly improved by the present invention. Further, the power delivered to the phase detector is dependent upon the impedance match at the phase detector and the phase of any impedance mismatch. Since the phase is changing with the FM signal, the gain of the phase detector is a function of modulating voltage. Therefore, the linearity of the phase detector is degraded which also causes FM distortion when the FM signal is summed at the output of the phase detector. When the FM signal is applied at the variable phase shifting network, the FM sensitivity is relatively insensitive to this effect also. When applying the FM signal at the phase detector output, the maximum deviation obtainable is limited to pi/2 radians, the maximum capability of the phase detector. However, when applying the modulation signal at the variable phase shifting network, the maximum phase shift attainable is limited only by the peak phase shift of the phase shifting network. This allows much larger FM deviations to be obtained with cascaded variable phase shifting networks driven by the FM signal in parallel.

BRIEF DESCRIPTION OF THE DRAWINGS

FIGS. 4A and 4B are a detailed block diagram illustrating the implementation of the preferred embodiment of the present invention.

DETAILED DESCRIPTION OF THE PREFERRED EMBODIMENT

Figure 1:
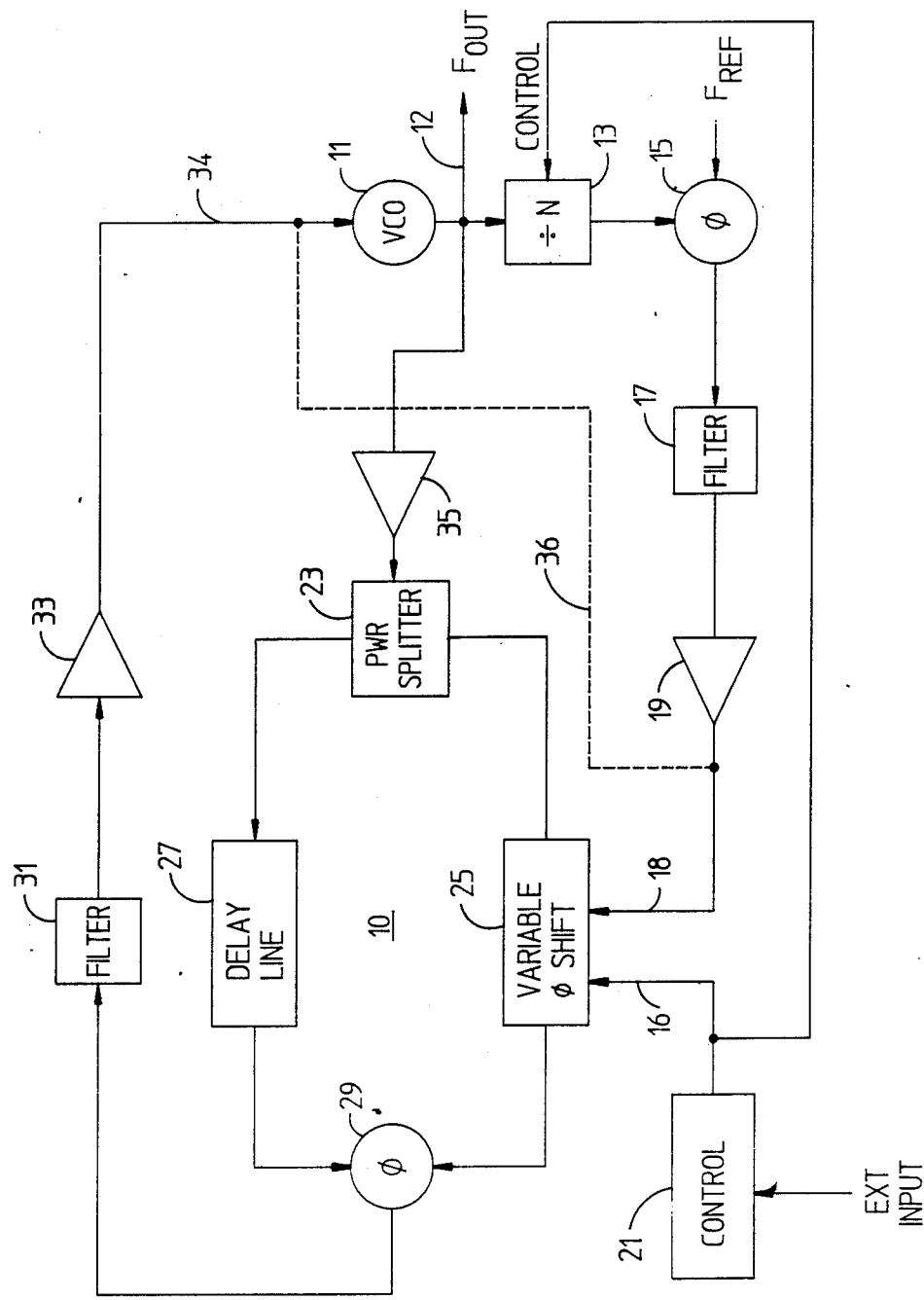
FIG. 1 is a conceptual block diagram of a frequency synthesizer according to the principles of the present invention.
Figure 2:
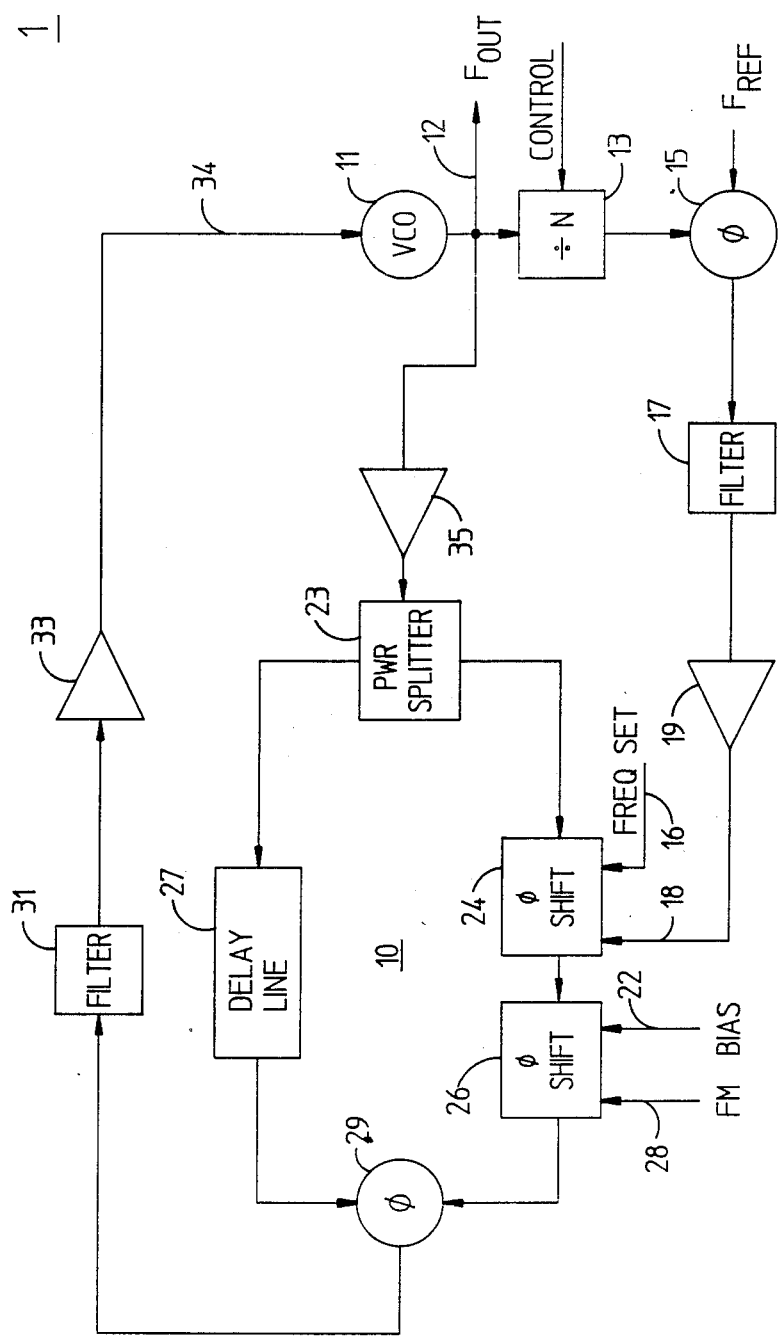
FIG. 2 is a conceptual block diagram of an alternate implementation of the present invention.

Referring now to the drawings and particularly to FIGS. 1 and 2, a frequency synthesizer adapted to provide a low noise frequency modulated (FM) output signal including a voltage controlled oscillator (VCO) 11 having a first feedback loop comprising a phase locked loop (PLL) and a second feedback loop comprising a frequency locked loop (FLL) is shown. A desired output frequency, $F_{out}$, for the VCO 11 and other operational modes for the frequency synthesizer are selected in accordance with parameters input through a front panel or other external input circuits (not shown) to the control or microprocessor circuits 21 to provide control signals to various components such as the variable phase shift network 25 and the divide-by-N block 13. The PLL includes VCO for providing an output signal $F_{out}$ on line 12 in accordance with a frequency control signal applied to the VCO 11 on line 34. The output of the VCO 11 is frequency divided by the divide-by-N block 13 to provide an input signal to the PLL phase detector 15 having a frequency equal to the VCO 11 output frequency divided by a selectable number N. PLL phase detector 15 compares the phase of a predetermined reference signal, $F_{ref}$, with the phase of the frequency divided VCO output signal and produces an error signal having a voltage which is proportional to the phase difference between the two signals input to the phase detector 15. The error signal output by the PLL phase detector 15 is coupled to a PLL filter 17 and the PLL gain amplifier 19 to provide a PLL tune signal. The gain of the PLL components, particularly the VCO 11, may be frequency sensitive. The PLL gain amplifier 19 and PLL filter 17 include compensation circuitry (not shown) for providing a tune signal to the VCO 11 for selectably controlling the VCO output frequency having a constant predetermined sensitivity for the full VCO frequency range. In a conventional, prior art PLL the tune signal output by the amplifier 19 would be coupled back to the VCO 11 as indicated by the dashed line 36. In the present invention, the PLL tune signal output by the gain amplifier 19 is coupled on line 18 to an input to a voltage controlled variable phase shift network 25 in a delay line discriminator 10.

The frequency synthesizer of the present invention further includes a FLL comprising delay line discriminator 10 which measures FM noise of the VCO 11 output signal and feeds back a frequency control signal (VCO tune signal) on line 34 to minimize the VCO 11 phase noise. The delay line discriminator 10 comprises an RF power amplifier 35 driving a power splitter 23 which provides two signal paths to the inputs of a phase detector 29. One signal from the power splitter 23 is coupled to the phase detector 29 via a coaxial delay line 27 having a time delay Tau producing a phase shift which is a function of the VCO 11 output frequency. The other signal from the power splitter 23 is coupled to a second input for the phase detector 29 via a voltage controlled variable phase shift network 25. The phase shift in the signal introduced by the variable phase shift network 25 is adjustable to provide a phase detector 29 output voltage of approximately zero volts (quadrature) at the desired VCO 11 output frequency. If the frequency of the signal at the input of the power amplifier 35 changes, the coaxial delay line 27 changes the phase relationship between the two signals at the input ports of the phase detector 29 thereby causing the phase detector 29 output to be other than zero volts thus providing a control signal proportional to the difference between the frequency of the VCO 11 output signal and the desired VCO 11 output frequency. This control signal is then coupled back to the VCO 11 via a FLL filter 31 and integration amplifier 33. The FLL filter 31 and integration amplifier 33 include FLL gain compensation circuitry (not shown) to compensate for frequency sensitive FLL components and provide a frequency control or VCO tune signal having a constant predetermined sensitivity over the full VCO frequency range.

In accordance with the principles of the present invention, the PLL is combined with the FLL by coupling the output of the PLL gain amplifier 19 on line 18 to the frequency discriminator variable phase shift network 25. This allows the PLL tune voltage derived from the error signal from the PLL phase detector to adjust the phase shift of the variable phase shift network 25 to compensate for the changes in the output frequency of the VCO 11. Coupling the PLL and FLL together in this manner allows the FLL phase detector 29 to operate at its optimum point; i.e., the voltage of the output signal, $V_d$, being near zero, and takes advantage of the high loop gain of the FLL to correct frequency fluctuations in the output signal of the VCO 11. This allows the use of a narrow bandwidth PLL to provide precise phase coherency to a reference frequency and reduce phase noise at small frequency offsets from the carrier frequency. The wide bandwidth characteristics of the FLL then minimize the phase noise at intermediate to large frequency offsets from the carrier frequency. The control input from controller 21 to the variable phase shift network 25 on line 16 provides a signal to initially adjust the variable phase shift network operating point and tune the VCO 11 to the desired output frequency.

The frequency synthesizer 1 output signal on line 12 may also be frequency modulated (FM) by applying an FM signal to the variable phase shift network 25. To minimize distortion products, the FM signal is applied to a variable phase shift network which is separate from the variable phase shift network utilized to set the frequency of operation of the delay line discriminator and the VCO 11. As is shown in FIG. 2, two variable phase shift networks 24 and 26 are provided. As described hereinabove, the PLL tune voltage on line 18 and initial frequency control signal on line 16 are applied to the variable phase shift network 24. The FM signal on line 28 is applied to a voltage controlled variable phase shift network 26 to modulate the output signal VCO 11 at rates within the FLL bandwidth. An FM bias voltage on line 22 is also applied to the variable phase shift network 26 to set the operating point of the phase shift network 26 for maximum gain, $K_p$, (radians per volt). In circuits of this type, linearity is maximized by minimizing the derivatives of $K_p$ with respect to the FM control voltage by setting the bias of the phase shift network 26 at the maximum $K_p$; the first derivative of $K_p$ will equal zero and second harmonic distortion is minimized.

Figure 3A:
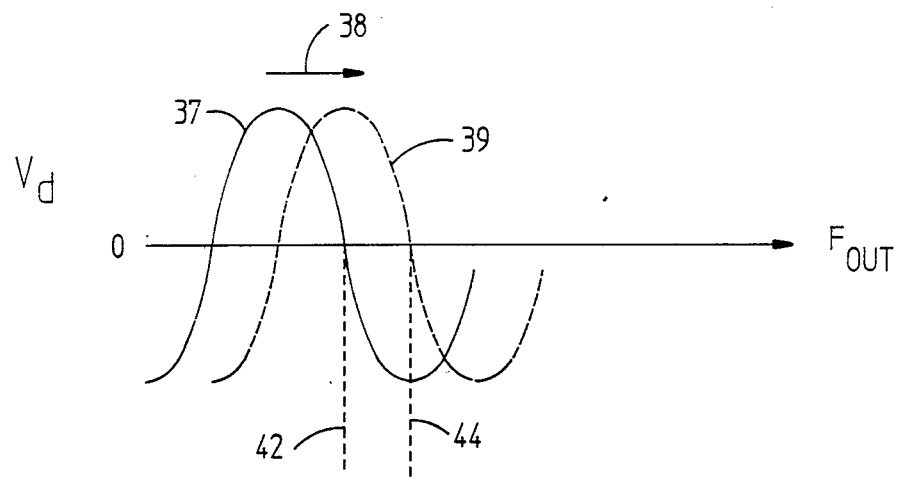
FIG. 3A is a qraphical representation of the transfer function for a typical delay line discriminator utilized in the present invention.
Figure 3B:
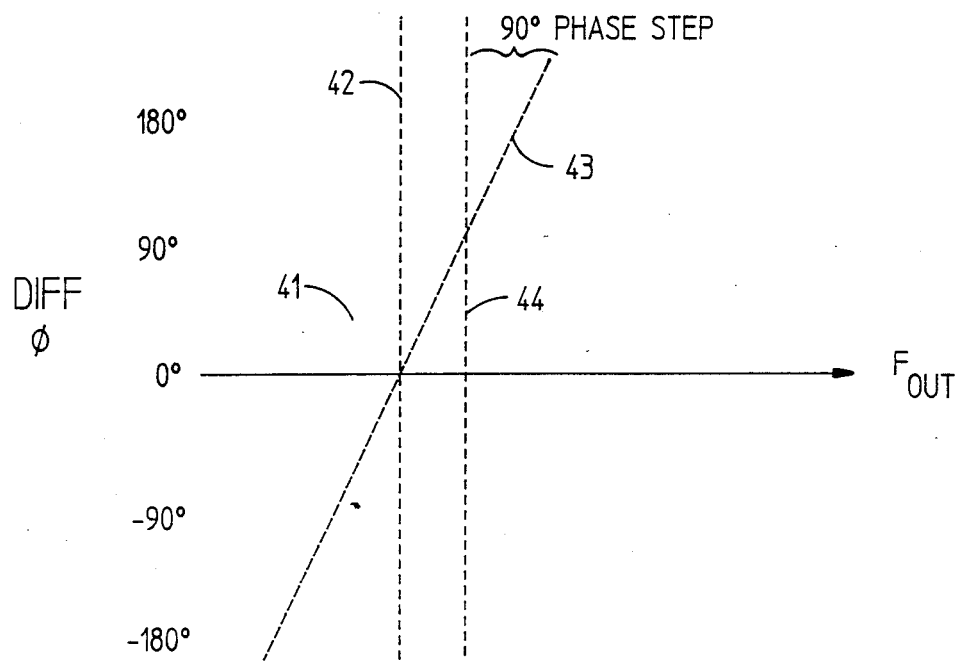
FIG. 3B is a graphical representation of the differential phase characteristic for a delay line discriminator used in the present invention.

Referring now also to FIGS. 3a and 3b, curves 37 and 41 represent the transfer function and the differential phase characteristic of the delay line discriminator 10, respectively. The time delay network 27 utilized in the frequency discriminator 10 is a delay line comprising a predetermined length of coaxial cable having a time delay Tau. The delay time Tau is a constant and therefore the phase difference at the inputs to the phase detector 29 will be a linear function of $F_{out}$ as shown in FIG. 3b. When a balanced mixer is used as the phase detector 29, the response to the differential phase at its inputs is sinusoidal as shown by curves 37, 39 in FIG. 3a. The differential phase input, curve 41, to the phase detector 29 determines the output voltage $V_d$ of the phase detector as shown by the transfer characteristic curve 37. The control signal on line 16 adjusts the variable phase shift network 25 (or 24) to an operating point such as the examples shown by curves 41 and 43. To operate the delay line discriminator 10 at its optimum point, i.e., $V_d=0$, the control signal on line 16 is utilized to adjust the variable phase shift network 25 so that the discriminator transfer function at the desired frequency 44 corresponds to a zero crossing point as in curve 39.

Figure 4A:
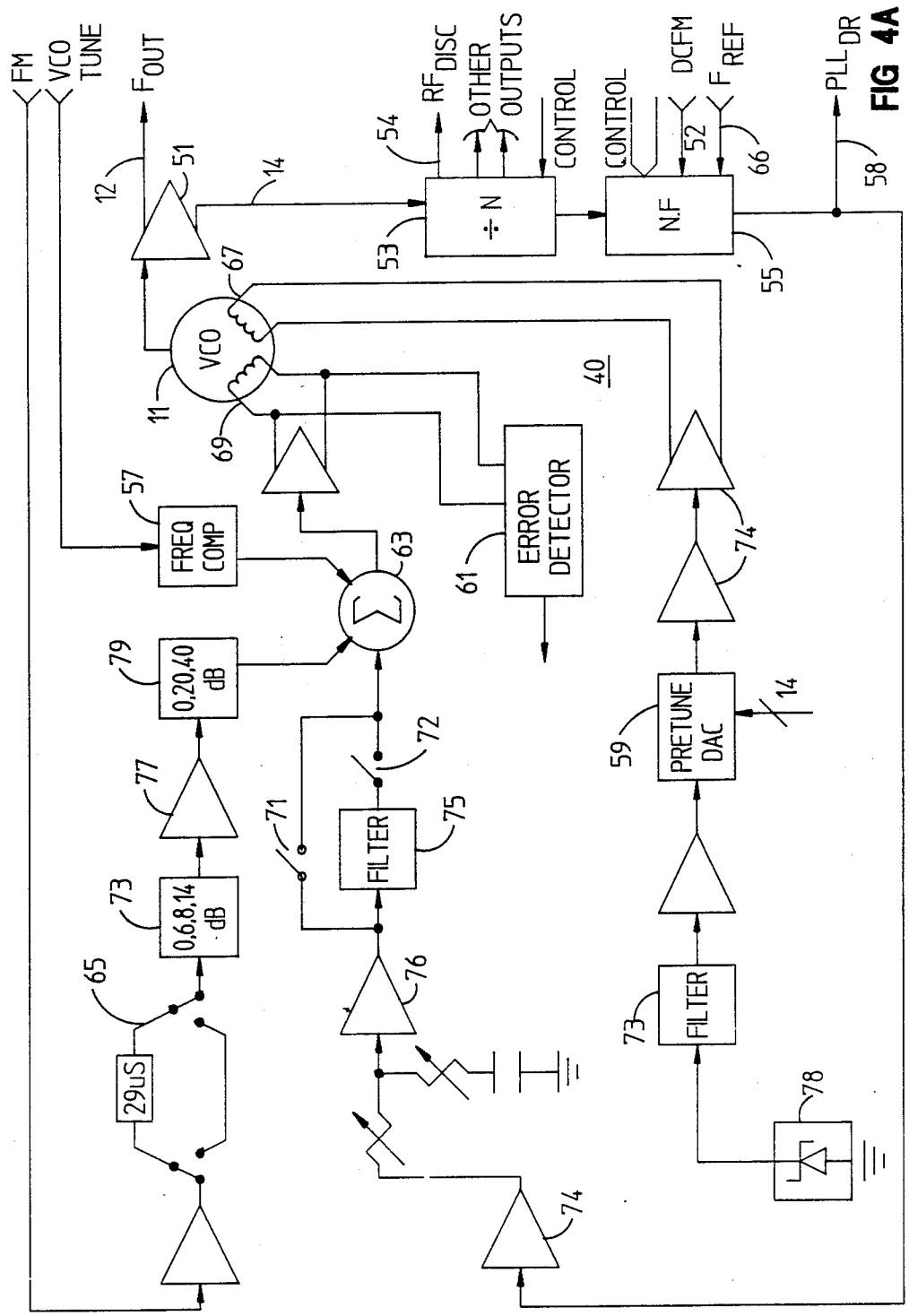

Referring now to FIGS. 4a and 4b, a functional block diagram of the preferred embodiment of the present invention is shown. The phase locked loop 40 comprises a YIG tuned oscillator 11 having a main tuning coil 67 a fine tuning coil 69 and providing an output frequency of 3-6 GigaHertz. The output signal of the VCO 11 is applied to amplifier 51 which provides the VCO output signal, $F_{out}$ on line 12 and a second VCO output signal on line 14 to the divide-by-N block 53. The divide-by-N block 53 comprises a controllable divider which provides a selectable integer divisor N to provide a frequency divided output signal on line 48 to the fractional-N block. The divide-by-N block also provides a number of outputs including an RF discriminator, $RF_{disc}$, signal on line 54 coupled to the power splitter 23. The fractional-N block comprises a programmable divide circuit which further divides the signal on line 48 by a selectable rational number and provides the further divided VCO output signal to a phase detector (not shown). The phase detector compares the phase of the frequency divided VCO output signal with the phase of a predetermined reference signal input on line 66 and provides an error signal on line 58 which is proportional to the amount of phase difference between the frequency divided VCO output signal and the predetermined reference signal. The phase detector error signal on line 58, known as the PLL drive signal, $PLL_{dr}$, is coupled to the delay line discriminator on line 58 and is also coupled back to the VCO 11 on line 36 via switches 71 and 72 is utilized when the VCO 11 is operated in a PLL mode only. The PLL 40 also includes circuitry to provide a main tuning signal to the VCO main tuning coil 67. Digital frequency control signals from the controller 21 (as shown in FIG. 1) provide a pretune signal to the pretune DAC 59. The pretune signal from the pretune DAC 59 is applied to the main tuning coil 67 via main coil drive amplifiers 74. Zener diode 78 provides a temperature stable reference voltage for DAC 59.

The RF discriminator signal on line 54 is coupled to the power splitter 23 via an RF power amplifier 111, 113 and delta network 115. A RF discriminator signal on line 72 is split off of delta network 115 for unrelated use elsewhere in the apparatus. The power splitter 23 utilized is a seven db coupler which provides the RF discriminator signal to two separate signal paths which form the delay discriminator 10. A first RF discriminator signal is coupled on line 84 to a 140 nanosecond delay line 27 comprising a predetermined length of coaxial cable and is then coupled to a voltage controlled variable phase shift network 83. The output of the variable phase shift network 83 is coupled to a first input of the phase detector 29. A second RF discriminator signal is coupled from the power splitter 23 on line 82 to a cascaded pair of identical voltage controlled variable phase shift networks 85 and 87. The output of the second variable phase shift network 85 is then coupled to a second input of the phase detector 29. The phase detector 29 provides an output signal on lines 86 and 88 which is an error voltage, $V_d$, proportional to the phase difference between the input signals to the phase detector 29. The output of the phase detector 29 is coupled to integration amplifier 95 and 125 via switching network 81. The output of the integration amplifier at amplifier 125 is a VCO tune signal on line 56. The VCO tune signal on line 56 is coupled back to the VCO 11 via frequency compensation circuit 57 and summer 63. The output signal of the fractional-N block 55 on line 58 is coupled to the voltage controlled variable phase shift networks 85, 87 via low pass filter 117 and amplifiers 119 and 123. There are provisions made for an external discriminator signal on line 62 which is summed with the PLL drive signal on line 58 at the summer 97. The low rate components, i.e., less than one Hz, of the PLL drive signal are indicative of frequency drift in the VCO 1 output frequency caused by temperature effects. Amplifier 123 integrates the DC components of the PLL drive signal to provide DC adjustments to the cascaded variable phase shift networks 87, 85 to compensate for changes of the delay time Tau of delay line 27 due to changes in the ambient temperature. The output signal, the PLL drive signal, of fractional-N block 55 on line 58 is also coupled to the voltage controlled variable phase shift network 83 via summer 99 and amplifiers 107 and 109. The PLL drive signal coupled to variable phase shift network 83 provides control to compensate for phase and frequency fluctuations in the VCO 11 output frequency within the PLL bandwidth. DAC 89 provides a pretune adjustment to the variable phase shift networks 85, 87 to set the operating frequency point of the delay line discriminator. Frequency modulation of the VCO 11 output signal is provided by a combination of three different techniques. A DCFM input signal on line 52 to the fractional-N block 55 provides modulation signals for DC and low frequency rates within the PLL bandwidth. A second FM signal is applied on line 68 to a attenuator 101 and also on line 64 coupled to the summer 63 for FM rates outside both the PLL bandwidth and the FLL bandwidth. The FM signal on line 68 is coupled to voltage controlled variable phase shift network 83 to effect FM at modulation rates within the FLL bandwidth. The output of summer 99 is coupled via amplifiers 107 and 109 to variable phase shift network 83 to effect FM within the FLL bandwidth. DAC 91 provides a bias signal to adjust the operating point of phase shift network 83. From the preceding discussion it is seen that the VCO tune signal on line 56 includes both FM components and phase noise and other frequency fluxuation components. The VCO tune signal on line 56 is now summed with the out of band FM signal on line 64 at summer 63. The output of summer 63 is applied to the VCO 11 FM tuning coils 69. To provide constant gain over the desired frequency range the out of band FM signal is coupled to summer 63 via a delay equalizer circuit 65 and attenuators 73, 77 and 79.

To effect switching from one desired frequency to another desired frequency with minimum settling time, when it is desired to switch frequencies, the PLL drive signal input to amplifier 119 and to the variable phase shifter 85, 87 is opened by grounding the signal at the input of amplifier 119 and at the input to the variable phase shifter 85, 87 via switches 118 and 122, respectively. The frequency locked loop is then unlocked and opened utilizing switch 96 at the output of the integration amplifier 95. The loop divisor number is then changed to the next desired setting and the PLL is locked up by closing switch 71 (switch 72 is open) thus coupling the PLL drive signal on line 36 to the VCO 11 frequency control coil 69. Once the PLL is locked up, the variable phase shift network 85, 87 is adjusted for zero volts at the output of the phase detector 29 by DAC 89. The FLL is then reconnected by closing switch 96 and the PLL drive signal path on line 58 is reconnected by closing switches 119 and 122. The PLL established by the PLL drive signal path on line 36 is then disconnected by opening switch 71.

I claim:

1. A frequency synthesizer apparatus of the phase locked loop type comprising:

controlled oscillator means having an output terminal and a frequency control terminal, said controlled oscillator means providing an output signal to said output terminal having a selectable frequency determined by the magnitude of a frequency control signal applied to said frequency control terminal;

a first feedback path responsive to said output signal provided by said controlled oscillator means to said output terminal thereof for supplying a feedback signal to said frequency control terminal of said controlled oscillator means, said first feedback path including a frequency discriminator network including a first phase detector means having an output port and first and second input ports and first coupling means for coupling said output signal from said output terminal to said first and second input ports of said first phase detector means, time delay means having a time delay of Tau, said time delay means being connected to delay said output signal coupled t one of said first and second input ports, variable phase shift means having a phase shift control terminal, said variable phase shift means connected to shift the phase of the output signal coupled to one of said first and second input ports of said first phase detector, said first phase detector providing a first error signal to said output port thereof, the magnitude of said first error signal proportional to the difference in phase between the signals coupled to said first and second input ports of said first phase detector, said first error signal provided by said first phase detector coupled to said frequency control terminal of said controlled oscillator means;

a second feedback path responsive to said output signal provided by said controlled oscillator means to said output terminal thereof for supplying a feedback signal to said frequency control terminal of said controlled oscillator means, said second feedback path including a second phase detector means having an output port and first and second input ports, said first input port of said second phase detector coupled to said output terminal of said controlled oscillator means for receiving a signal at a frequency dependent on the output frequency of said controlled oscillator means, said second input port of said second phase detector means for receiving a reference signal having a predetermined frequency, said second phase detector providing a second error signal to said output port thereof, the magnitude of said second error signal proportional to the difference in phase between the signals coupled to said second phase detector, second coupling means coupling said second error signal to said phase shift control terminal of said variable phase shift means for controlling the magnitude of the phase shift provided by said variable phase shift means; and controller means responsive to an applied frequency selection signal representative of a currently selected controlled oscillator means output frequency, said controller means including means for providing a bias signal to said variable phase shift means that allows said variable phase shift means to provide as value of phase shift that causes the absolute value of said first error signal provided to the output port of said first phase detector to be equal to a minimum value when the current output frequency of the controlled oscillator means is equal to said currently selected controlled oscillator means output frequency.

2. The frequency synthesizer apparatus as in claim 1 further comprising switching means coupled to said second phase detector output port for selectively coupling said second error signal to said controlled oscillator means frequency control terminal and decoupling said second error signal from said phase shift control terminal of said variable phase shift means when the frequency of said controlled oscillator means output signal is changed from a first desired frequency to a second desired frequency.

3. The frequency synthesizer apparatus as in claim 1 further comprising frequency divider means coupled between said controlled oscillator means output port and said second phase detector first input port, said frequency divider means for providing a signal to said second phase detector having a frequency substantially equal to the frequency of said output signal divided by a selectable predetermined rational number.

4. The frequency synthesizer apparatus as in claim 3 wherein said controlled oscillator means comprises a YIG tuned oscillator including a tuning coil for receiving a pretune signal for tuning said YIG oscillator to a desired frequency.

5. The frequency synthesizer apparatus as in claim 1 wherein said minimum value is substantially equal to zero.

* * * * *